(12) United States Patent
Chou et al.

(10) Patent No.: US 6,337,277 B1
(45) Date of Patent: Jan. 8, 2002

(54) CLEAN CHEMISTRY LOW-K ORGANIC POLYMER ETCH

(75) Inventors: Wen-Ben Chou, Palo Alto; Rajinder Dhindsa, San Jose; Ching-Hwa Chen, Milpitas, all of CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/606,842

(22) Filed: Jun. 28, 2000

(51) Int. Cl.[7] .............................................. H01L 21/302
(52) U.S. Cl. ...................... 438/689; 438/706; 438/745; 438/704
(58) Field of Search ................................ 438/689, 706, 438/745, 704

(56) References Cited

U.S. PATENT DOCUMENTS

| | | | |
|---|---|---|---|
| 5,294,568 A | * 3/1994 | McNeilly et al. | 437/235 |
| 5,439,553 A | * 8/1995 | Grant et al. | 216/58 |
| 5,662,772 A | * 9/1997 | Scheiter et al. | 216/2 |
| 5,683,591 A | * 11/1997 | Offenberg | 216/2 |
| 5,776,832 A | * 7/1998 | Hsieh et al. | 438/669 |
| 5,916,824 A | * 6/1999 | Mayuzumi et al. | 438/753 |

OTHER PUBLICATIONS

Hsiao et al., "Cryogenic Etching of Polymer in RFI Oxygen Plasma," Electronchemical Society Proceedings vol. 96–12, pgs. 544–555.

*Primary Examiner*—Benjamin L. Utech
*Assistant Examiner*—Vanessa Perez-Ramos
(74) *Attorney, Agent, or Firm*—Beyer Weaver & Thomas, LLP

(57) ABSTRACT

A method of cleanly etching an organic polymer layer disposed over a substrate is disclosed. The invention is particularly useful in damascene processing where openings are etched in the organic polymer layer to form interconnects. The method includes lowering the temperature of the substrate. The method also includes flowing $H_2O$ vapor over the organic polymer layer and condensing (or freezing) the $H_2O$ vapor on the organic polymer layer. The method additionally includes etching through the organic polymer layer and the condensed $H_2O$ vapor to form an opening having a side wall. The condensed (or frozen) $H_2O$ vapor is arranged to form a passivating film (of ice) along the side wall of the opening to protect the side wall from etching.

20 Claims, 7 Drawing Sheets

CLEAN CHEMISTRY LOW-K ORGANIC POLYMER ETCH

BACKGROUND OF THE INVENTION

The present invention relates to the fabrication of semiconductor integrated circuits (IC's). More particularly, the present invention relates to methods and apparatuses for cleanly etching through an organic polymer layer of an IC layer stack.

During the manufacture of a semiconductor-based product, for example, a flat panel display or an integrated circuit, multiple deposition and/or etching steps may be employed. During deposition, materials are deposited onto a substrate surface (such as the surface of a glass panel or a substrate). For example, deposited layers such as various forms of silicon, silicon dioxide, silicon nitride, metals, dielectrics, polymers and the like may be formed on the surface of the substrate. Conversely, etching may be employed to selectively remove materials from predefined areas on the substrate surface. For example, etched features such as vias, contacts, or trenches may be formed in the layers of the substrate.

In semiconductor IC fabrication, successive layers of various materials are deposited on the substrate to form a layer stack. For example, layers of insulator, conductor and semiconductor are generally formed on the surface of the substrate. These layers are generally etch patterned to form devices such as transistors, capacitors, resistors and the like. In addition, conductive interconnect lines are employed to couple the devices of the IC together to form the desired circuit. The conductive interconnect lines can be formed in a variety of ways. In some processes, interconnects are formed by depositing a metal layer over the substrate, etching the metal layer to form conductive lines and filling the open areas surrounding the conductive lines with a dielectric material. In other processes, the interconnects are formed by depositing an insulating layer over the substrate, etching the insulating layer to form openings and filling the openings with a conductive material. By way of example, in damascene processing, openings are etched in a low K organic polymer layer and filled with a copper-based material to form the conductive interconnect lines.

In some cases, a passivating film is purposefully created on the side walls of the etched opening during etching to protect the side walls from etching and to control the profile angle of the opening. The passivating film generally consists of polymers formed from photoresist, the etchant source gases, and/or their reaction products. By way of example, while etching a low K organic polymer layer, some fluourocarbon etchants, e.g., $CHF_3$, $CH_2F_2$, $CH_3F$, $CH_4$, $C_4F_8$, $C_2F_6$, $C_2HF_5$ and/or the like, are typically used to help form polymer deposits on the walls of the opening. The polymer deposits are typically formed from fluorine and carbon contained in the fluorocarbon etchant source gas. In addition, some fluorine containing etchants may leave deposits on the side walls of the opening as well, by combining with carbon, which is produced during etching of a photoresist layer.

One problem associated with this technique is that the gas chemistry used to form the passivating film is not a clean chemistry. By clean chemistry, it is meant that the chemistry used to process the substrate leaves little or no polymer deposits. The aforementioned gas chemistries, e.g., fluourocarbons, generally leave a substantial amount of polymer deposition on the substrate that typically requires special and tedious clean treatment after the etch. By way of example, substrate stripping is one conventional technique for removing polymer deposits from the substrate. In stripping, substrate processing is stopped in order to input a stripping gas, and export the removed material. Other techniques may include using a chemical treatment, for example, an ammonia and hydrofluoric acid solution may be used to remove the deposits. In this case, the process must be carefully controlled to prevent the solution from attacking portions of the integrated circuit. As should be appreciated, both stripping and chemical treatments disadvantageously lower substrate throughput, and typically add costs due to the loss of production. Moreover, these cleaning processes may only be marginally successful. That is, not all of the deposits will be removed in stripping or chemical treatments. As a result, substrate yield will be adversely effected. For example, the deposits may become an impediment to forming the integrated circuit, especially as devices get smaller and smaller and more closely packed together.

Not only do the polymer deposits effect the substrate, but they also effect the surrounding process chamber. That is, the deposits may accumulate on the chamber walls and become a source of harmful particulate, especially when the deposits flake off onto the substrate surface. For example, particles on the substrate surface may block a portion of the substrate that needs to be etched. As should be appreciated, these deposits, as well as any resulting particulate contamination, may produce undesirable and/or unpredictable results. For example, accumulation of material on the chamber may lead to variations in process performance, i.e., etch rate, etch uniformity, etch profile and the like. As such, it is extremely difficult to control the critical dimensions of the integrated circuit, and as a result, the possibilities of device failure are increased. As should be appreciated, device failure tends to lead to a reduction in productivity, and higher costs for the manufacturer.

Conventional techniques for removing build-ups of deposits inside the process chamber include, for example, wet cleaning and dry cleaning. In wet cleaning, the reactor has to be shut down, and the parts have to be manually removed. In dry cleaning, substrate processing is stopped in order to input a cleaning gas, and export the removed material. Similarly to the above, both cleaning processes disadvantageously lower substrate throughput, and typically add costs due to loss of production. In addition, these processes may only be marginally successful. That is, not all of the deposits will be removed in the cleaning process.

In view of the foregoing, there are desired improved techniques and apparatuses for providing a clean etch process.

SUMMARY OF THE INVENTION

The invention relates, in one embodiment, to a method of etching a layer disposed over a substrate. The method includes flowing $H_2O$ vapor over the layer. The method further includes condensing the $H_2O$ vapor on the layer. The method additionally includes etching through the layer to form an opening having a side wall. The condensed $H_2O$ vapor is arranged to cover the side wall to protect the side wall from etching. The invention is particularly useful in etching an organic polymer layer.

The invention relates, in another embodiment, to a method for etching a substrate in a plasma process chamber. The method includes providing a substrate having a substrate surface. An organic polymer layer is disposed over the substrate surface and an etch mask is disposed over the organic polymer layer. The method further includes flowing a condensable vapor into the process chamber and condensing (or freezing) the condensable vapor at least on the surface of the organic polymer layer. The method additionally includes flowing an etchant source gas into the process chamber and forming a plasma from the etchant source gas. The method also includes etching through the organic polymer layer using at least the plasma. The etching is arranged to form an opening with a side wall in the organic polymer layer. Additionally, during etching, the condensed (or frozen) condensable vapor is arranged to form a passivating film along the side wall to protect the side wall from etching.

In most embodiments, a clean chemistry is used for both the condensable vapor and the etchant source gas. By way of example, the clean chemistry generally includes an $H_2O$ vapor and an $O_2$ etchant source gas. These gases may be premixed or separately delivered into the process chamber. In some embodiments, the $H_2O$ vapor is condensed (or frozen) on the layer by lowering the temperature of the substrate. In other embodiments, the condensed (or frozen) $H_2O$ vapor (or ice) is evaporated from the layer by increasing the temperature of the substrate.

The invention relates, in another embodiment, to a plasma processing apparatus for processing a substrate. The plasma processing apparatus includes a process chamber. The plasma processing apparatus further includes a gas injector for introducing $H_2O$ vapor into the process chamber. The plasma processing apparatus additionally includes a pedestal disposed within the process chamber. The pedestal is configured for holding the substrate. The plasma processing apparatus also includes a cooling device connected to the pedestal and which is adapted for lowering the temperature of the substrate to cause the $H_2O$ vapor to freeze on the surface of the substrate.

The invention relates, in another embodiment, to a method of etching an organic polymer layer disposed over a substrate. The method includes cooling the substrate to between about −20° C. to about −40° C. and etching the organic polymer layer.

DESCRIPTION OF THE DRAWINGS

The present invention is illustrated by way of example, and not by way of limitation, in the figures of the accompanying drawings and in which like reference numerals refer to similar elements and in which.

DESCRIPTION OF THE INVENTION

Figure 1:
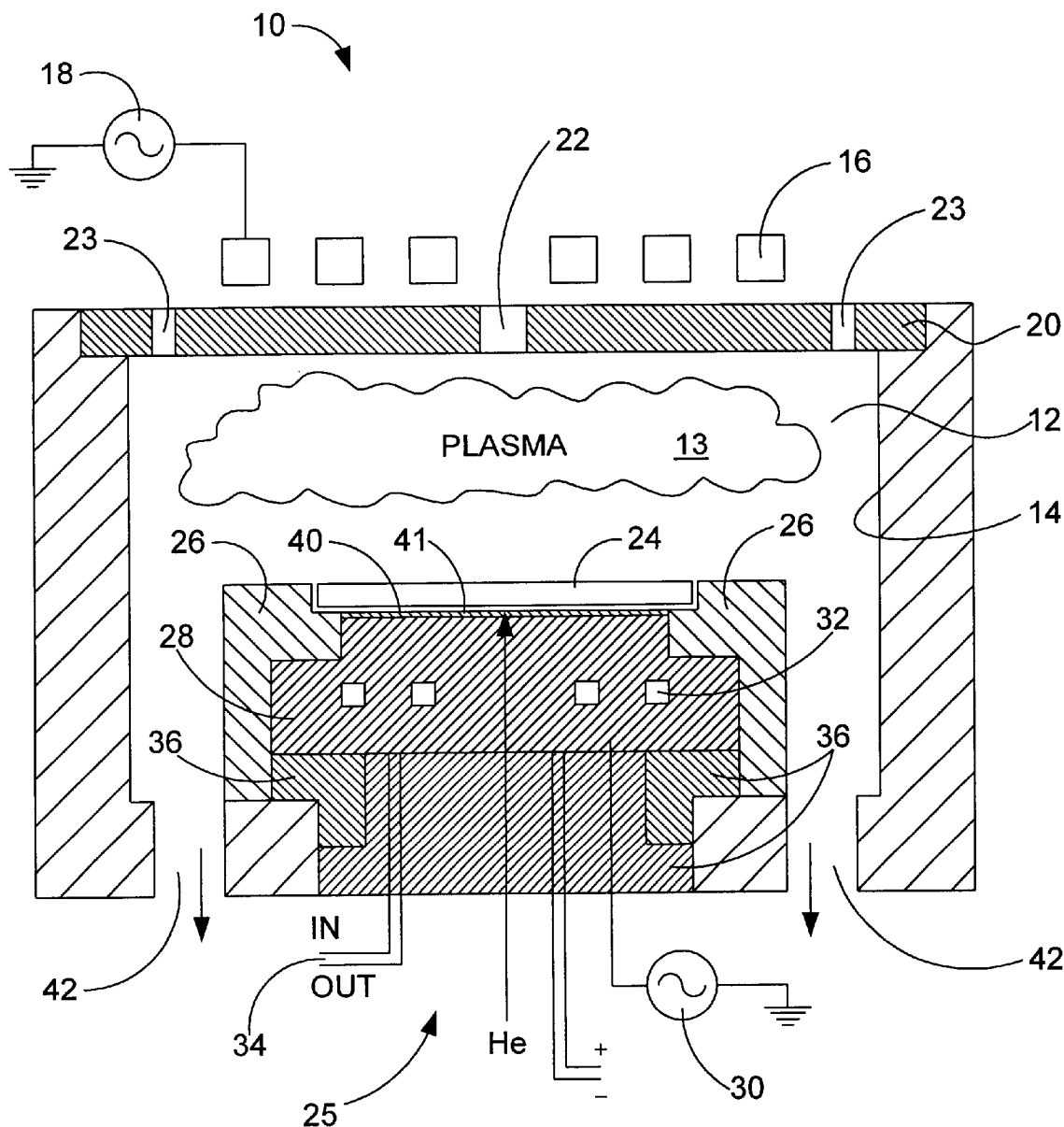
FIG. 1 is a simplified schematic diagram of a plasma reactor suitable for etching a substrate, in accordance with one embodiment of the present invention.

The present invention will now be described in detail with reference to a few preferred embodiments thereof and as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order not to unnecessarily obscure the present invention.

Broadly speaking, the invention pertains to a clean etch process. By clean etch, it is meant that the process is free of polymer producing chemistries that can both soil the processed substrate and the areas surrounding the substrate such as the process chamber walls with polymer deposits. The invention consists of flowing a clean process gas, which contains both an etchant and a condensable species, over a substrate to be processed, and performing a low temperature etch. By low temperature etch, it is meant that the substrate is cooled so that the condensable species is condensed on the surface of the substrate. As such, a passivating film of condensed species is continuously formed on the side walls of the etched opening during the etch process such that the side walls are protected from etching and a desired profile angle is obtained. Openings with substantially vertical profile angles can be formed or if a particular profile angle is needed, the profile angle can be controlled to a certain degree. Furthermore, once the etch process is completed, the process is stabilized such that the condensed species, including the passivating film, evaporate off the surfaces of the substrate i.e., the side walls, thereby leaving a clean etch process. The invention is particularly useful in damascene processing where openings are etched in an organic polymer layer to form interconnects.

In accordance with one aspect of the present invention, the etching apparatus is a plasma reactor that includes a process chamber, at least one injector for introducing an etchant source gas and a condensable vapor into the process chamber, a pedestal for holding a substrate to be processed, and a cooling mechanism for condensing the condensable vapor on the surface of the substrate. In one embodiment, the cooling mechanism is a temperature controlled pedestal having a cooling channel for cooling the substrate. The substrate temperature is generally reduced to a temperature that effectively condenses the condensable vapor on the surface of the substrate. That is, the temperature of the substrate is arranged to correspond to the temperature at which the condensable vapor is condensed.

In accordance with another aspect of the present invention, the etchant source gas is used to etch an opening in a layer of a cooled substrate, and the condensable vapor is used to form a passivating film on the side walls of the etched opening. The etching process generally includes flowing the condensable vapor over the layer, condensing the condensable vapor on the layer, and etching through the layer with the etchant source gas to form an opening having a side wall. The condensable vapor is arranged to continuously flow and therefore to continually condense on the cooled layer during etching. More particularly, the condensable vapor is arranged to continually condense on the side walls of the opening in order to protect the side wall from etching. Following the etch process, the temperature of the substrate is allowed to rise so that the condensed vapor evaporates from the side walls thereby leaving a clean opening. The evaporation process can be accomplished in a variety of ways. By way of example, the evaporation process can be accomplished by bringing the process chamber to ambient conditions, i.e. cross over pressure and temperature, and removing the substrate from the pedestal. In another example, the evaporation process can be accomplished by increasing the temperature of the pedestal (either by reducing or stopping the flow of coolant through the pedestal). The later example may not be feasible in most process chambers because of engineering constraints.

In accordance with one embodiment of the present invention, an $O_2$ etchant source gas is used to etch an organic polymer layer, and an $H_2O$ vapor is used to form the side wall passivation. The etching process includes flowing $H_2O$ vapor over the organic polymer layer, condensing the $H_2O$ vapor on the organic polymer layer, and etching through the organic polymer layer to form an opening having a side wall. The $H_2O$ vapor is arranged to continuously condense on the side walls during etching to protect the side wall from etching. Both $O_2$ and $H_2O$ are clean gases and therefore do not create unwanted polymer deposits. For example, following the etch process, the condensed $H_2O$ vapor can be evaporated from the side walls to leave a clean opening, i.e., one without polymers, in the organic polymer layer. In one embodiment, the $O_2/H_2O$ chemistry is used in Damascene processing to form interconnect openings in a organic polymer layer.

FIG. 1 is a schematic diagram of a plasma reactor 10, in accordance with one embodiment of the present invention. Plasma reactor 10 includes a process chamber 12, a portion of which is defined by chamber walls 14, and within which a plasma 13 is both ignited and sustained for processing a substrate 24. Substrate 24 represents the work piece to be processed, which may represent, for example, a semiconductor substrate to be etched or otherwise processed or a glass panel to be processed into a flat panel display. In the illustrated embodiment, the process chamber 12 is arranged to be substantially cylindrical in shape, and the chamber walls are arranged to be substantially vertical. It should be understood, however, that the present invention is not limited to the above and that various configurations of the process chamber, including the chamber walls, may be used.

Outside process chamber 12, there is disposed an inductive electrode 16 (represented by a coil) that is coupled to a first RF power supply 18 via a matching network (not shown in FIG. 1 to simplify the illustration). The first RF power supply 18 is configured to supply the inductive electrode 16 with RF energy. As shown, a dielectric window 20 is disposed between the inductive electrode 16 and the substrate 24. The dielectric window is configured to allow the passage of the RF energy from the inductive electrode 16 to the interior of the process chamber 12. That is, the inductive electrode 16 and the dielectric window 20 are configured to couple power to a plasma 13. Although the electrode/window arrangement is shown above the process chamber, it should be noted that it could also be positioned around the sides of the process chamber as well. Electrodes and windows are well known in the art and for the sake of brevity will not be discussed in greater detail.

The plasma reactor 10 also includes a first gas port 22 and a second gas port 23, which are both disposed around the inner periphery of the process chamber 12, and more particularly through the dielectric window 20. The gas ports 22, 23 are arranged for releasing gaseous source materials into the RF-induced plasma region between the dielectric window 20 and the substrate 24. In one implementation, the first gas port 22 is adapted for introducing the etchant source gases into the RF-induced plasma region, and the second gas port 23 is adapted for introducing a condensable vapor into the RF-induced plasma region. By way of example, the etchant source gas may be $O_2$ and the condensable vapor may be water vapor ($H_2O$). Conversely, the first gas port 22 could be adapted for introducing the condensable vapor into the RF-induced plasma region, and the second gas port 22 could be adapted for introducing the etchant source gases into the RF-induced plasma region. In another implementation, both the first port 22 and the second port 23 are adapted for introducing the etchant source gases and condensable vapor, which are pre-mixed, into the RF-induced plasma region. Alternatively, the gaseous source materials may also be released from ports built into the walls of the process chamber itself or through a shower head arranged in the dielectric window. In most cases, process uniformity is generally desired, and therefore, the arrangement of ports 22 and 23, whether used separately or together, should be configured to enhance the plasma uniformity across the surface of the substrate.

In most embodiments, the substrate 24 is introduced into the process chamber 12 and disposed on a pedestal 25, which is configured for supporting and holding the substrate 24 during processing. The pedestal 25 generally includes an electrode 28, a chuck 40, and a focus ring 26. The electrode 28 is biased by a second RF power supply 30 (also typically via a matching network) that is configured to supply the electrode 28 with RF energy. The electrode 28 is thus configured for generating an electric field that is sufficiently strong to couple energy through the chuck 40, the focus ring 26, and the substrate 24. By way of example, the energy generated by the electrode 28 may be arranged to form a bias voltage, between the surface of the substrate 24 and the plasma 13, that is used to accelerate the ions in the plasma 13 towards the substrate 24. Furthermore, although the electrode is shown and described as being coupled to the RF power supply 30, it should be understood that other configurations may be used to accommodate different process chambers or to conform to other external factors necessary to allow the coupling of energy. For example, in some single frequency plasma reactors the pedestal may be coupled to ground.

In one embodiment of the present invention, a heat transfer system is provided within the pedestal, and more particularly the electrode, to control the temperature of the substrate during processing. The heat transfer system is generally configured for distributing a coolant through the electrode such that the temperature of the substrate is reduced. In one embodiment, the heat transfer system is arranged to cool a substrate to a temperature that effectively condenses the condensable vapor on the surface of the substrate (for a given pressure). In most cases, the temperature of the substrate is configured to only correspond with the temperature needed to condense the condensable vapor. In embodiments using $H_2O$ vapor at low pressures, it has been found that a substrate temperature of less than or equal to $-10°$ C., and more particularly between about $-20°$ C. to about $-40°$ C. may be used to effectively condense the $H_2O$ vapor on the surface of the substrate. As should be appreciated, it is not practical to have too low a substrate temperature because at really low temperatures, for example about $-100°$ C., everything starts condensing on the substrate. For example, temperatures that are too low may lead to adverse processing effects. In addition, it may be difficult to build a cost effective pedestal that can operate at temperatures that low. Furthermore, although a range is given, it should be noted that the range may need to be adjusted depending on the process recipe used to process the substrate. For example, the pressure and the gas mixture are two components of a process recipe that may alter the desired temperature range.

Referring to FIG. 1, the heat transfer system generally includes a main channel 34 for distributing a heat transfer medium or coolant to a plurality of inner cooling channels 32. In one implementation, a coolant formed from FLUORINET, which is available from 3M, is used. In order to achieve the desired substrate temperatures, the pedestal, and more particularly the electrode, is generally cooled between about 10° C. to about 15° C. less than the desired substrate temperature. For example, in the case of $H_2O$ vapor, it has been found that a pedestal temperature between about $-30°$ C. to about $-55°$ C. may be used to obtain the desired substrate temperatures. Furthermore, because of the cooler temperatures, the electrode 28 needs to be properly insulated from the environment and/or the surrounding materials and surfaces. Accordingly, the pedestal 25 includes a plurality of insulators 36 disposed around the electrode 28. Although the insulators are only shown below the electrode, it should be understood they may be placed anywhere around the electrode, for example, on the sides of the electrode.

With regards to the focus ring 26, the focus ring 26 is arranged to improve the electrical and mechanical properties of the etch near the substrate's edge, as well as to shield the electrode 28 and the chuck 40 from the reactants (i.e., ion bombardment). As such, the focus ring 26 is arranged to surround the edge of the substrate 24 and is disposed above the electrode 28 and around the chuck 40. In most cases, the focus ring 26 is configured to be a consumable part that is replaced after excessive wear. The focus ring 26 may be formed from a suitable dielectric material such as silicon, silicon oxide, silicon nitride, silicon carbide, quartz and the like.

With regards to the chuck 40, the chuck 40 is coupled to the upper surface of the electrode 28 and generally includes a organic polymer layer 41 that is configured for receiving the backside of the substrate 24 when the substrate 24 is placed on the pedestal 25 for processing. In the illustrated embodiment, the chuck 40 represents an ESC (electrostatic) chuck, which secures the substrate 24 to the chuck's surface by electrostatic force. However, it should be understood that a mechanical type chuck may also be used. Furthermore, because the esc clamping force is directly functional to the temperature of the organic polymer layer 41, i.e., the dielectric properties change with temperature, the organic polymer layer is preferably designed for low temperature applications. By way of example, the organic polymer layer may be formed from ceramic or anodized aluminum. In some embodiments, a helium cooling gas may also be delivered to the back side of the substrate to help control the temperatures of the substrate 24 (by removing the heat produced on the substrate) during processing, thereby ensuring uniform and repeatable processing results.

Additionally, the pedestal 25 is arranged to be substantially cylindrical in shape and axially aligned with the process chamber such that the process chamber and the pedestal are cylindrically symmetric. However, it should be noted that this is not a limitation and that the pedestal placement may vary according to the specific design of each plasma processing system. In addition, the pedestal 25 generally includes a push pin configured for moving the substrate from a first position (not shown) for loading and unloading the substrate to a second position (as shown) for processing the substrate. The first position is generally positioned far enough away from the pedestal so that the substrate may be easily transported to and from the push pin. In one embodiment, the condensed vapor is evaporated from the surfaces of the substrate after processing by lifting the substrate off of the pedestal 25. As should be appreciated, the temperature of the substrate generally increases by removing the substrate from the pedestal. Push pin transport systems are well known in the art and for the sake of brevity will not be discussed in greater detail. Additionally, the pedestal may also be configured to move between a first position (not shown) for loading and unloading the substrate 24 and a second position (as shown) for processing the substrate.

Moreover, an exhaust port 42 is disposed between the chamber walls 14 and the pedestal 25. The exhaust port 42 is configured for exhausting gases formed during processing, and is generally is coupled to a turbomolecular pump (not shown), located outside of the process chamber 12. In most embodiments, the turbomolecular pump is arranged to maintain the appropriate pressure inside the process chamber 12. Furthermore, although the exhaust port is shown disposed between the chamber walls and the pedestal, the actual placement of the exhaust port may vary according to the specific design of each plasma processing system. For example, exhausting gases may also be accomplished from ports built into the walls of the process chamber.

Figure 2:
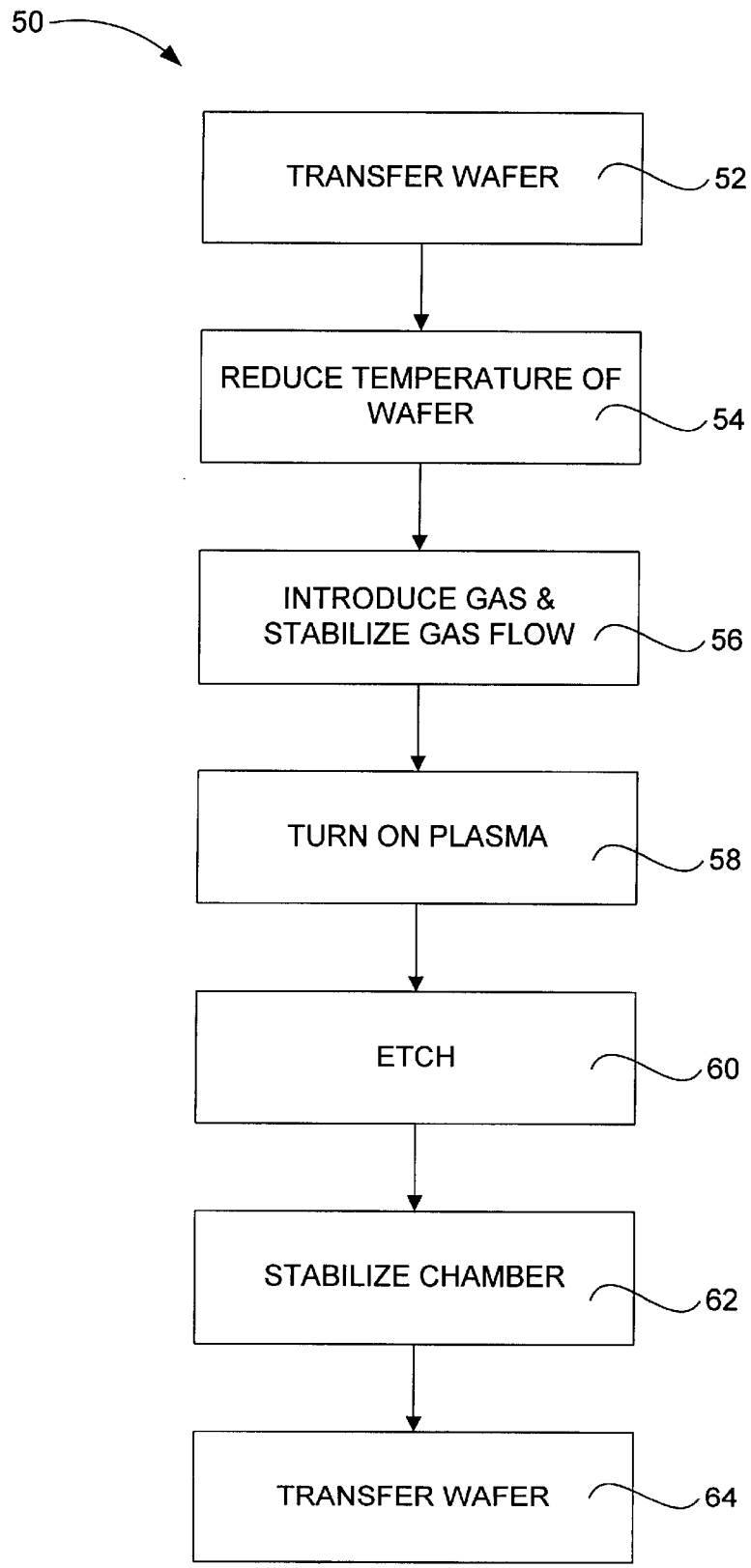
FIG. 2 is a flow diagram of an etch process, in accordance with one embodiment of the present invention.

FIG. 2 is a process flow diagram illustrating a method of etching a substrate with a clean chemistry using, for example, the plasma reactor of FIG. 1. The process of etching the substrate begins at step 52 where conventional pre-etch steps are performed. In most cases, a substrate is transported into the process chamber and placed on the pedestal, and more particularly on the surface of the chuck. By way of example, a transport arm may be used to transfer a new substrate into the chamber, and a push pin may be used to lower the new substrate to the surface of the chuck. The chuck then clamps the new substrate to hold it in place during processing. As mentioned, clamping may include engaging the new substrate mechanically or electrically (e.g., turning on voltage of electrostatic chuck).

After clamping, the process flow proceeds to step 54 where the temperature of the substrate is reduced. By way of example, in embodiments using $H_2O$ vapor at low pressures, it has been found that a substrate temperature of less than or equal to $-10°$ C., and more particularly between about $-20°$ C. to about $-40°$ C. may be used. In one embodiment, the temperature of the substrate is reduced by cooling the pedestal, and more particularly the top surface of the chuck. That is, a coolant is delivered through the cooling channels to transfer heat from the substrate in contact with the chuck.

After or during step 54, the process flow proceeds to step 56 where both a condensable vapor and an etchant source gas are introduced into the process chamber. In one embodiment, the etchant source gas is an $O_2$ based chemistry and the condensable vapor is $H_2O$ vapor. The $O_2$ chemistry is configured for etching an opening in an organic polymer layer and the $H_2O$ vapor, when condensed, is configured for protecting the side walls of the opening during etching. These gases may be introduced at the same time or at different times depending on the specific needs of the substrate to be processed. Step 56 typically involves stabilizing the pressure and the flow of the gases. That is, the etchant source gas ($O_2$) and the condensable vapor ($H_2O$) are flowed into the chamber and allowed to stabilize at specific pressure used for processing the substrate. The pressure ranges are generally low, for example less than 100 mTorr, however it should be noted that this is not a limitation and that the pressure may vary according to the specific needs of each process and/or chamber. These low pressures are generally well known in the art and for the sake of brevity will not be discussed in greater detail. In most cases, the condensable vapor ($H_2O$) is arranged to sublimate at these low pressures. That is, the condensable vapor ($H_2O$) is arranged to change from gaseous state to a solid state without becoming a liquid. Therefore, as the condensable vapor ($H_2O$) is flowed into the chamber, the condensable vapor ($H_2O$) starts to freeze (gas to a solid) at least on the surface of the substrate because of the cooler temperatures of the substrate. In one embodiment, a organic polymer layer is disposed over the substrate and a patterned mask is disposed over the dielectric lay organic polymer layer and therefore, the condensable vapor ($H_2O$) condenses (or freezes) over the surfaces of the organic polymer layer and over the surfaces of the patterned mask.

After the stabilization process in step 56 is completed, and the condensed (or frozen) layer is formed over the surface of the substrate, a plasma is created in step 58. In order to create a plasma, and referring to FIG. 1, a process gas ($O_2$) is input into the process chamber 12 through the gas port 22. Power is then supplied to the inductive electrode 16 using the first RF power source 18, and a large electric field is induced inside the process chamber 12 through the dielectric window 20. The electric field accelerates a small number of electrons present inside the chamber causing them to collide with the gas molecules of the process gas. These collisions result in ionization and initiation of a discharge or plasma 13. As is well known to those skilled in the art, the neutral gas molecules of the process gas when subjected to these strong electric fields lose electrons, and leave behind positively charged ions. As a result, positively charged ions, negatively charged electrons and neutral gas molecules are contained inside the process chamber 12.

The ignited plasma is then stabilized to a specific etch pressure inside the chamber. Other gases such as Ar, He and $N_2$ may be used along with $O_2$ to help stabilize the plasma. Furthermore, once the plasma has been formed, neutral gas molecules inside the plasma tend to be directed towards the surface of the substrate. By way of example, one of the mechanism contributing to the presence of the neutrals gas molecules at the substrate may be diffusion (i.e., the random movement of molecules inside the chamber). Thus, a layer of neutral species (e.g., neutral gas molecules) may typically be found along the surface of substrate 24.

After the chamber pressure has stabilized, step 60, which is the actual etch step, takes place. During the etch step 60, the electrode 28 is powered causing ions to accelerate towards the substrate where they, in combination with neutral species, activate the etching reaction. As such, an opening in the organic polymer layer is formed. Also during etching, the condensable vapor ($H_2O$) is diffused around the chamber, and thus a layer of condensed condensable vapor (or ice) is continuously formed on the surface of substrate 24. In effect, the condensable vapor ($H_2O$) condenses (or freezes) when it comes into contact with the surfaces of the substrate. As such, the condensed vapor (or ice) tends to form a layer on both the horizontal surfaces and the vertical surfaces. The horizontal surfaces, however, are generally etched away more rapidly than the vertical surfaces due to the ion sputter nature of the etching process, i.e., a majority of the etchants are directed towards the substrate while only a small amount of etchants are directed at the sides. As such, the vertical surfaces continue to grow throughout the process and as a result form a passivating film of condensed condensable vapor (ice) along the side wall of the etched openings. That is, at same time the opening is etched downward, a passivating film is being built up along the sides of the opening. The passivating film is arranged to protect the side wall from etching. As a result, a near 90 degree profile angle can be achieved.

Furthermore, because of the slow downward etch through the organic polymer is accompanied by simultaneous lateral growth of the passivating film, the organic polymer profile has both a vertical downward component and a lateral side way component as the etch progresses. As such, the passivating film may also be used to control the profile angle or slope of the side wall. It is generally believed that a greater amount (i.e., thickness) of passivation produces a larger taper, and a lesser amount of passivation produces a smaller taper. In fact, in one embodiment, a larger amount of condensable vapor ($H_2O$) is introduced into the chamber to produce more passivation and as a result a greater taper. In another embodiment, a smaller amount of condensable vapor ($H_2O$) is introduced into the chamber to produce less passivation, and as a result a smaller taper. By way of example, a profile angle of between 80 degrees and between about 90 degrees may be obtained using the $O_2/H_2O$ based chemistry.

The etch is terminated using a conventional end pointing process, and then the a process flow proceeds to step 62. In step 62, the flow of the process gases are stopped and the process chamber is stabilized. During stabilization, the pressure and temperature inside the chamber are brought to ambient conditions. By way of example, the pressure inside the chamber is increased to a cross over pressure of about 90 mTorr and the temperature inside the process chamber is increased to about 25° C. Upon reaching ambient conditions, the process flow proceeds to step 64 where the substrate is transferred away from the pedestal in order to raise its temperature and remove the condensed condensable vapor (ice). In one embodiment, the substrate is transferred to a hot stage to raise its temperature. In another embodiment, the substrate is left in the ambient environment to raise its temperature. By raising the temperature of the substrate, the condensed condensable vapor (ice) evaporates and leaves the surfaces of the substrate. Accordingly, no additional process steps and no additional etch recipes are needed to remove by-products from the side wall. That is, there is no by-products to remove. Essentially, all that needs to be done is to raise the temperature of the substrate to evaporate the passivation (or sublimate the solid back to a gas).

The process of forming openings in an organic polymer layer will now be described in FIGS. 3A–3E. By way of example, the method described herein can be used along with conventional damascene processing to form interconnects.

Figure 3A:
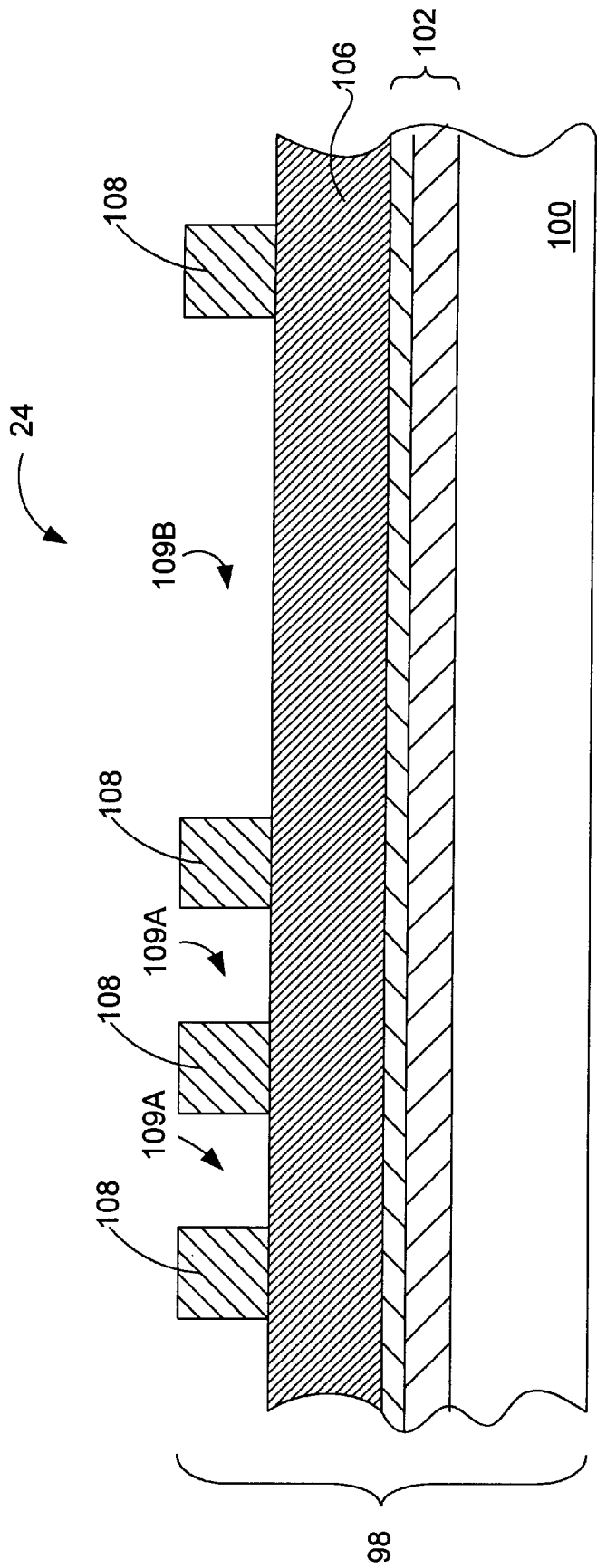
FIG. 3A is a side cross section view of a substrate including a layer stack, in accordance with one embodiment of the present invention.

FIG. 3A is a side cross section view of the substrate 24 including a layer stack 98 that may be etched with the aforementioned process, in accordance with one embodiment of the present invention. As shown, the layer stack 98 includes a plurality of layers including a substrate layer 100, previously formed layers 102, an organic polymer layer 106, and a patterned mask 108. The substrate 100 is a portion of the substrate, and may be a substrate of any suitable material, including any suitable semiconductor material. By way of example, a substrate formed from silicon may be used. The previously formed layers 102 are disposed over the substrate 100. Although not shown in this illustration, it should be understood that the previously formed layers 102 include layers of insulator, conductor and semiconductor, which form the active regions of the integrated circuit. By way of example, the active regions may include transistors, interconnects, capacitors, resistors and the like. Furthermore, a liner layer (not shown) may be disposed between the previously formed layers and the organic polymer layer to provide a diffusion barrier or a glue layer. These layers and their implementations are well known to those skilled in the art, and therefore will not be discussed in great detail here.

The organic polymer layer 106 is disposed over the previously formed layers 102. The organic polymer layer 106 is generally formed by depositing a suitable organic polymer material over the previously formed layers 102. In one embodiment, the organic polymer layer is formed from a low K organic polymer having a dielectric constant lower than about 3.7. By way of example, some low K organic polymers that may be used are polyimide, TEFLON, which is available from Dupont Corporation, SILK, which is available from Dow Chemical Corporation, or FLARE, which is available from Allied Signal. The mask 108, which is disposed over the organic polymer layer 106, is typically patterned with a plurality of narrow mask openings 109A and wide mask openings 109B. The mask 108 is formed using conventional fabrication techniques such as well known photolithography techniques, and may be a hard mask or a soft mask. By way of example, the mask may be formed from SiON, $SiO_2$, SiN, photoresist or the like. In one example, the patterning is accomplished by depositing a photoresist layer over the layer to be patterned, and then selectively exposing the photoresist to light through a patterned reticle. Once exposed, the photoresist is developed to form a photoresist mask that is used in etching layers that are exposed and not covered by the photoresist material.

Figure 3B:
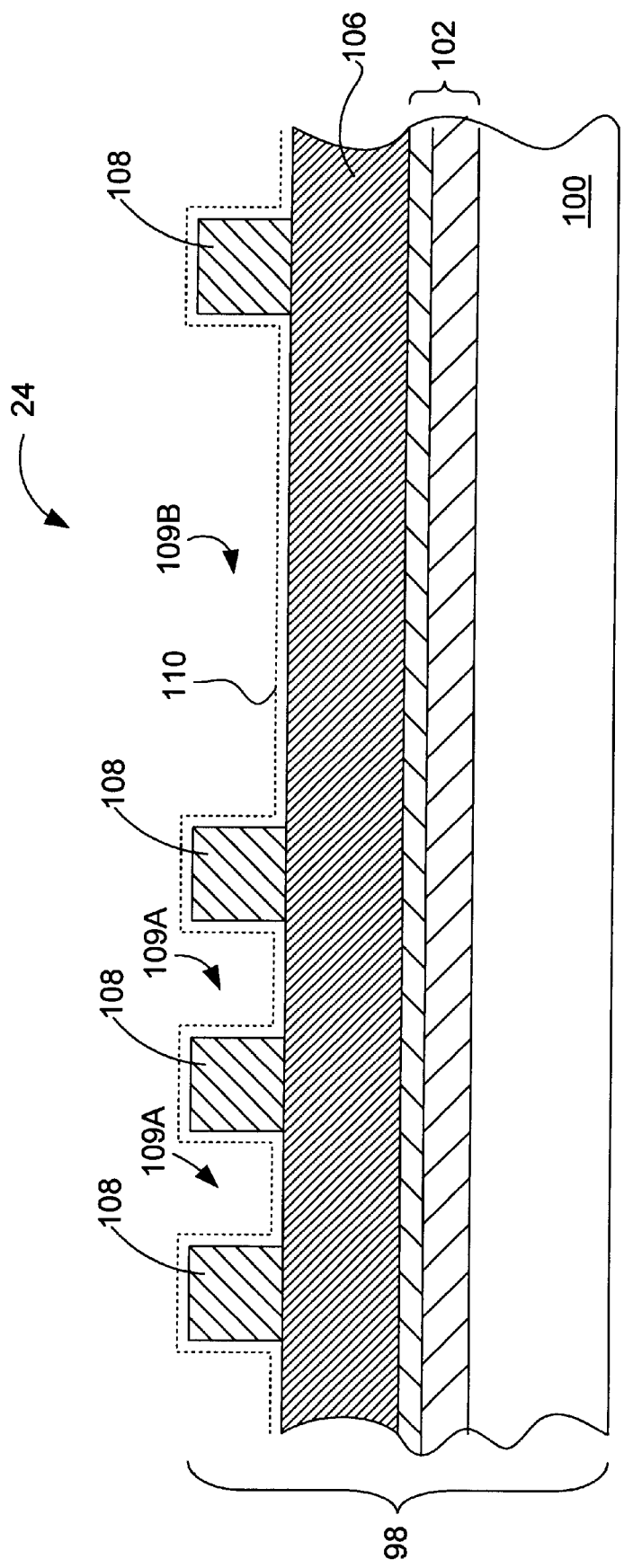
FIG. 3B is a side cross section view of the substrate including the layer stack of FIG. 3A after a condensed layer is formed thereon, in accordance with one embodiment of the present invention.

FIG. 3B is a side cross section view of the substrate 24 including the layer stack 98 of FIG. 3A after a condensed layer 110 is formed, in accordance with one embodiment of the present invention. The condensed layer 110 is formed by cooling the substrate 24, and flowing a condensable vapor over the surface of the substrate 24. During this process, the condensable vapor, because of the cooler surface, tends to condense or solidify over the surface of the substrate, thereby forming the condensed layer 110. As shown, the condensed layer 110, not only covers the top surfaces of the mask and organic polymer layer, but also the side walls of the mask. In one embodiment, the condensable vapor is formed from $H_2O$ and therefore, the condensed layer 110 is essentially ice.

Figure 3C:
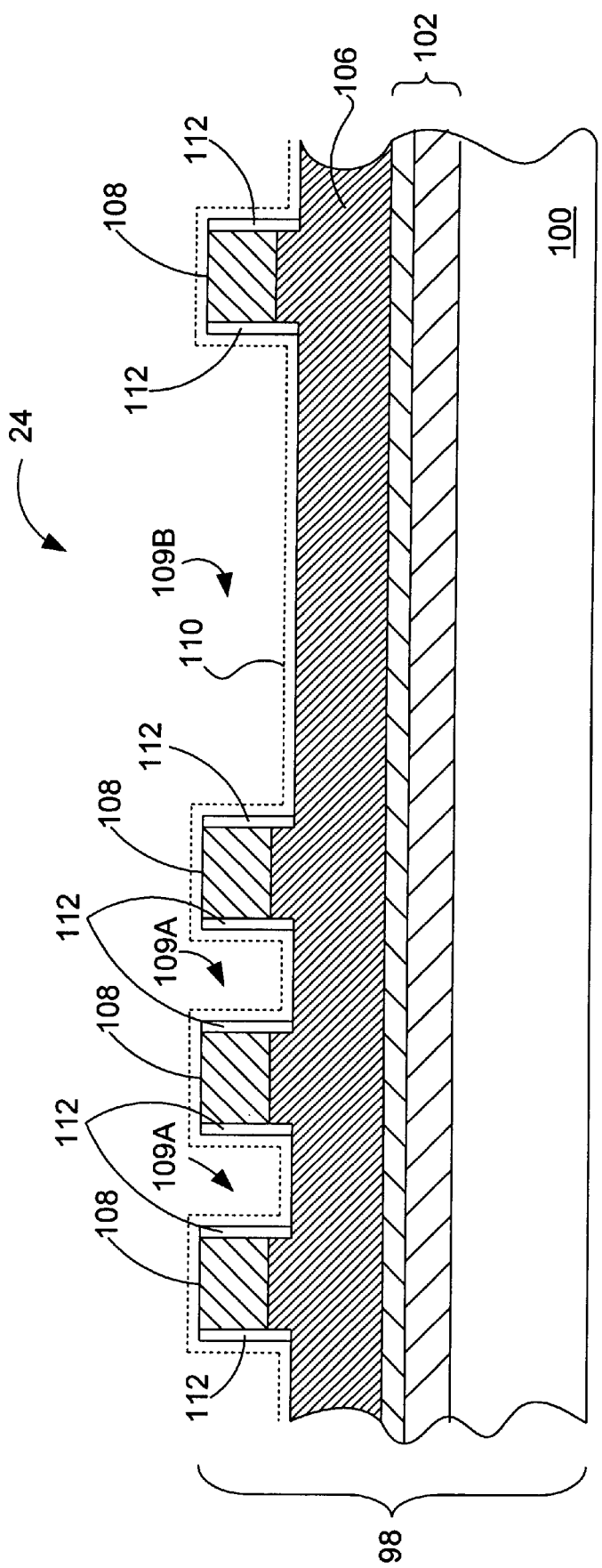
FIG. 3C is a side cross section view of the substrate including the layer stack of FIG. 3A, the condensed layer of FIG. 3B and a passivating film after a portion of a layer of the layer stack has been etched, in accordance with one embodiment of the present invention.

FIG. 3C is a side cross section view of the substrate 24 including the layer stack 98 of FIG. 3A and the condensed layer 110 after a portion of the organic polymer layer 106 has been etched using an $O_2$-based etchant source gas, in accordance with one embodiment of the present invention. Through the patterned narrow mask opening 109A and the wide mask opening 109B, etchants (formed by a plasma created with the $O_2$-based etchant source gas) react with the material of the organic polymer layer to form an etched feature in the organic polymer layer. During the etching process, the plasma tends to anisotropically etch openings having similar dimensions to the mask openings. The plasma also tends to erode away some of the mask 108 from an initial thickness. Furthermore, by controlling the gas chemistry and the reactor conditions, a passivating film 112 is formed (deposited), on the wall of the features, while the organic polymer is etched. While not wishing to be bound by theory, it is believed that the passivating film 112 is formed due to the build up of condensed condensable vapor along the side walls of the mask and along the side walls in the etched openings of the organic polymer layer 106. In other words, as the etchants etch away the organic polymer, a passivating film is built up along the vertical side walls. That is, the downward etch is accompanied by simultaneous growth of the passivating film. The passivating film forms a protective mask along the side walls of the organic polymer layer so that the side walls are preserved. In embodiments using $H_2O$ as the condensable vapor, the passivating film is essentially formed of ice, although some etch by-products may be present as well.

Figure 3D:
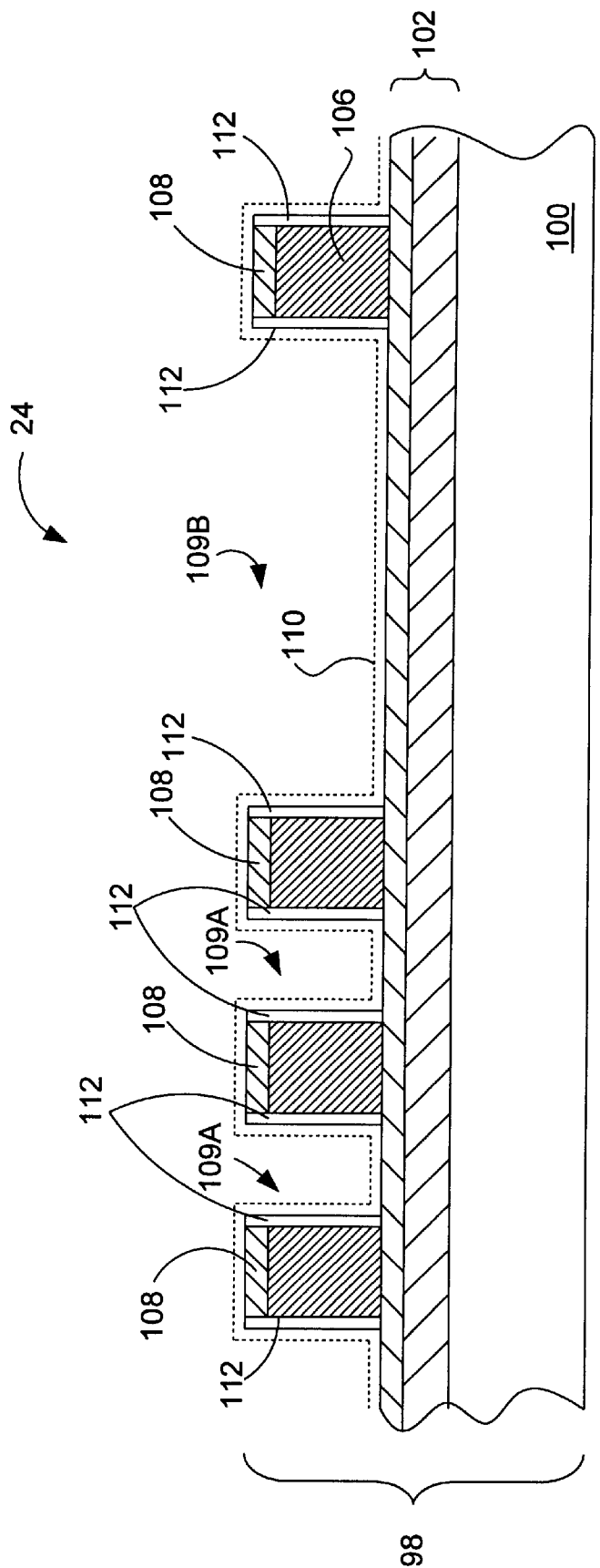
FIG. 3D is a side cross section view of the substrate including the layer stack of FIG. 3A, the condensed layer of FIG. 3B and the passivating film of FIG. 3C after the layer has been finally etched, in accordance with one embodiment of the present invention.

FIG. 3D is a side cross section view of the substrate 24 including the layer stack 98 of FIG. 3A, the condensed layer 110 and the passivating film 112 after the organic polymer layer 106 has been finally etched, in accordance with one embodiment of the present invention. Similarly to FIG. 3D, etchants (formed by the plasma created with the $O_2$-based etchant source gas) react with the remaining material of the organic polymer layer, through the patterned narrow mask opening 109A and the wide mask opening 109B, to continue to form the etched feature. During the etching process, the plasma tends to anisotropically etch the openings having similar dimensions to the mask openings. Typically, a profile angle between about 80 degrees to about 90 degrees is formed. The etch profile is measured as an angle formed by the etch side wall with a plane parallel to the top surface of the organic polymer layer. The plasma also tends to erode away some of the mask 108 from an initial thickness. As discussed, the side walls of the organic polymer layer are kept intact by the passivating film during the etch process. For example, voids may be produced in the opening if the passivating film were not covering the side walls during the etch process. As shown, etching with the etchant is substantially stopped on the previously formed layers 102, or shortly thereabove if a liner layer is used.

Figure 3E:
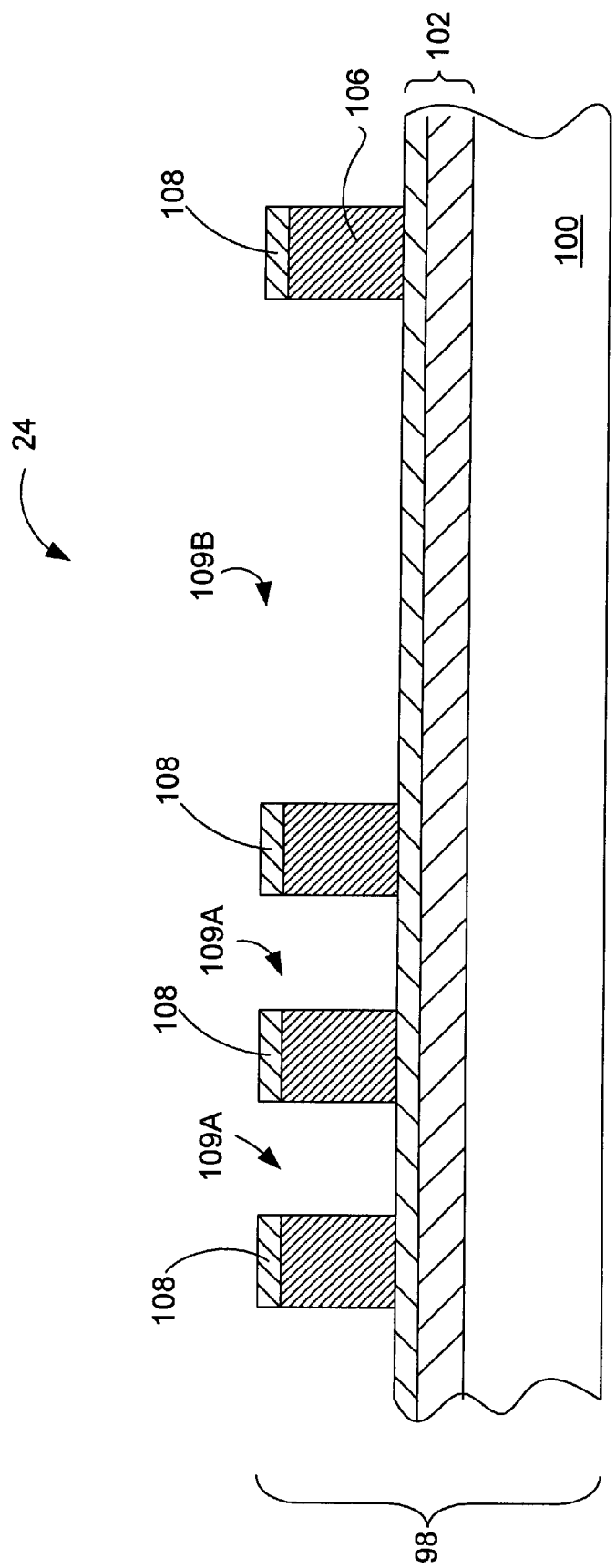
FIG. 3E is a side cross section view of the substrate including the layer stack of FIG. 3A after the condensed layer of FIG. 3B and the passivating film of FIG. 3C have been removed, in accordance with one embodiment of the present invention.

FIG. 3E is a side cross section view of the substrate 24 including the layer stack 98 of FIG. 3A after the condensed layer 110 and the passivating film 112 have been removed, in accordance with one embodiment of the present invention. The removal process includes returning the system to its initial and stable conditions and increasing the temperature of the substrate in order to cause the condensed vapor to evaporate. A simple water $H_2O$ rinse may also be used to further clean the substrate.

In one exemplary application of this invention, a 200 mm substrate having thereon a low K organic polymer layer and a photoresist mask is etched in a modified version of the inductively coupled TCP™ 9400 plasma reactor, which is available from Lam Research Corporation of Fremont, Calif. The modified TCP™ 9400 plasma reactor is similar to the plasma reactor described above with respect to FIG. 1. The low K organic polymer layer such as SILK, which is available from Dow Chemical Corporation, generally has a thickness on the order of 6000 angstroms to about 2 $\mu$m, and the photoresist layer has a thickness between about 6,000 to 8,000 angstroms. The resultant feature sizes of the openings are generally on the order of 0.15 $\mu$m for the smallest feature size and 0.50 $\mu$m for the largest feature size. It should be noted, however, that this invention is not limited to a particular sized substrate, a particular plasma processing system, a particular low k organic polymer layer or thickness, or a particular feature size.

In this application, the low K organic polymer layer is etched using an etch process that employs an $O_2/H_2O$-based chemistry. The pressure within the aforementioned plasma processing reactor system is maintained from about 6 milliTorr (mT) to about 20 mT, and more particularly at about 10 mT during etching. The top RF power is maintained from about 400 watts (W) to about 800 W, and more particularly at about 600 W. The bottom RF power is maintained from about 50 watts (W) to about 200 W, and more particularly at about 100 W. Furthermore, the flow rate of $O_2$ is maintained from about 60 standard cubic centimeters per minute (sccm) to about 500 sccm, and more particularly at about 300 sccm during etching. The flow rate of $O_2$ is between about 80% to 95% of the total flow. The flow rate of $H_2O$ is maintained from about 10 sccm to about 30 sccm, and more particularly at about 15 sccm during etching. In this application, the ratio of the $H_2O$ flow rate to the $O_2$ flow rate may be from about 5% to about 20% and more particularly at about 10%. It should be also noted that the above chemistry may include $N_2$. The flow rate of $N_2$ may be as little as 0 sccm to about 30 sccm or about 0% to about 10% of the $O_2$ flow. Furthermore, the etch source gas described above may also include other gases, for example, a diluent gas such as Argon or He.

It should be noted that the flow rates of the component source gases may be scaled as needed when smaller or larger substrates are involved. Thus, while the relative flow rate among the various component gases (which may be expressed as a percentage of the $O_2$ flow rate, for example) is important, the absolute flow rate for each component gas may be modified as needed to accommodate different substrate sizes.

Furthermore, although the present invention was shown in context of a plasma reactor, it is contemplated that the present invention may also be used in any reactor that is suitable for etching. By way of example, the present invention may be used in any of a number of suitable and known etching processes, including those adapted for dry etching, plasma etching, reactive ion etching (RIE), magnetically enhanced reactive ion etching (MERIE), electron cyclotron resonance (ECR), or the like. Further still, it is contemplated that the invention may be practiced in any of the above reactors, as well as other suitable plasma processing reactors. Note that the above is true irrespective of whether energy to the plasma is delivered through capacitively coupled parallel electrode plates, through ECR microwave plasma sources, or through inductively coupled RF sources such as helicon, helical resonators, and RF antenna (planar or non planar). Furthermore, a wave excited plasma process chamber may also be used.

As can be seen from the foregoing, the present invention offers numerous advantages over the prior art. One advantage of the present invention is that openings with straight profiles can be etched in an organic polymer layer with a clean chemistry and without using polymer passivation agents formed from Fluoro containing compounds, carbon containg compounds, $SO_2$ and the like. The clean chemistry advantageously uses condensed or frozen $H_2O$ vapor for forming a clean passivation layer during etching. The condensed $H_2O$ vapor can be easily removed from the substrate by increasing the temperature of the substrate, and allowing the condensed $H_2O$ vapor to evaporate. As a result of using the clean chemistry, clean-up is less and substrate throughput and yield are improved by not requiring any additional process steps to clean the substrate. By way of example, the present invention eliminates both a toxic clean chemical treatment and a stripping step, which are typically needed to remove polymer passivation agents. There are no extra steps for removing the passivating film or etch by-products other than a water rinse.

Another advantage of the present invention is that the $O_2/H_2O$ chemistry is an environmentally friendly process gas that can be safely discharged to the atmosphere with minimal or no additional processing. As such, this reduces the cost associated with abatement of harmful by-product gases. Other advantages include less chemical attacks on the underlying layers.

While this invention has been described in terms of several preferred embodiments, there are alterations, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method of etching a layer disposed over a substrate, comprising the steps of:
   flowing $H_2O$ vapor over the layer;
   condensing the $H_2O$ vapor on the layer; and
   etching through the layer to form an opening having a side wall, wherein the condensed $H_2O$ vapor is arranged to cover the side wall to protect the side wall from etching.

2. The method, as recited in claim 1, wherein the layer is an organic polymer layer.

3. The method, as recited in claim 2, wherein an etchant source gas formed from $O_2$ is used to etch the organic polymer layer.

4. The method, as recited in claim 1, wherein the step of condensing the $H_2O$ vapor comprises the step of lowering the temperature of the substrate to a temperature that condenses the $H_2O$ vapor.

5. The method, as recited in claim 4, wherein the temperature is between about $-20°$ C. to about $-40°$ C.

6. The method, as recited in claim 1, further comprising the step of disposing the substrate in a plasma processing chamber.

7. The method, as recited in claim 1, wherein the pressure inside the plasma processing chamber is low.

8. A method for etching a substrate in a plasma process chamber, comprising the steps of:
   providing a substrate having a substrate surface, the substrate including a organic polymer layer disposed over the substrate surface and an etch mask disposed over the organic polymer layer;
   flowing a condensable vapor into the process chamber;
   condensing the condensable vapor at least on the surface of the organic polymer layer;
   flowing an etchant source gas into the process chamber;
   forming a plasma from said etchant source gas; and
   etching through the organic polymer layer, to form an opening having a side wall, using the plasma, wherein during etching the condensed condensable vapor forms a passivating film along the side wall to protect the side wall from etching.

9. The method, as recited in claim 8, wherein the organic polymer layer has a dielectric constant of less than 3.7.

10. The method, as recited in claim 8, wherein the organic polymer layer is formed from a material selected from the group consisting essentially of polyimide, TEFLON, SILK or FLEER.

11. The method, as recited in claim 8, wherein the step of condensing the condensable vapor comprises the step of lowering the temperature of the substrate.

12. The method, as recited in claim 11, wherein the temperature is between about −20° C. to about −40° C.

13. The method, as recited in claim 11, further comprising the step of evaporating the condensed condensable vapor by increasing the temperature of the substrate.

14. The method, as recited in claim 8, wherein the condensable vapor is an $H_2O$ vapor.

15. The method, as recited in claim 8, wherein the etchant source gas includes $O_2$.

16. The method, as recited in claim 15, wherein the etchant source further includes at least one of Ar, He, or $N_2$.

17. The method, as recited in claim 8, further comprising the step of premixing the etchant source gas and the condensable vapor.

18. The method, as recited in claim 8, wherein the etchant source gas and the condensable vapor are separately delivered into the plasma process chamber.

19. The method, as recited in claim 8, wherein the plasma process chamber is selected from the group consisting essentially of an inductively-coupled plasma process chamber, a capacitively coupled plasma process chamber or a wave excited plasma process chamber.

20. A method of etching a organic polymer layer disposed over a substrate, comprising the steps of:

cooling the substrate to between about −20° C. to about −40° C.; and etching the layer.

* * * * *